United States Patent [19]

Shiromizu et al.

[11] Patent Number: 4,943,470
[45] Date of Patent: Jul. 24, 1990

[54] CERAMIC SUBSTRATE FOR ELECTRICAL DEVICES

[75] Inventors: Hisaharu Shiromizu; Asao Morikawa; Tsuneyuki Sukegawa; Kazuo Kondo, all of Aichi, Japan

[73] Assignee: NGK Spark Plug Co., Ltd., Aichi, Japan

[21] Appl. No.: 320,796

[22] Filed: Mar. 9, 1989

Related U.S. Application Data

[63] Continuation of Ser. No. 817,686, Jan. 10, 1986, abandoned.

[30] Foreign Application Priority Data

Jan. 11, 1985 [JP] Japan .................................. 60-3759
Jan. 22, 1985 [JP] Japan .................................. 60-9726
Feb. 26, 1985 [JP] Japan .................................. 60-37157

[51] Int. Cl.⁵ .............................................. B32B 9/00
[52] U.S. Cl. ..................................... 428/209; 428/210; 428/426; 428/432; 428/901; 156/89; 427/96; 427/97; 501/32; 501/53; 501/65; 501/69

[58] Field of Search ............. 428/209, 210, 426, 432, 428/901; 156/89; 427/96, 97; 501/32, 53, 55, 65, 66, 69

[56] References Cited

U.S. PATENT DOCUMENTS

| | | | |
|---|---|---|---|
| 3,914,128 | 10/1975 | Scheiber et al. | 96/115 P |
| 4,313,026 | 1/1982 | Yamada et al. | 174/68.5 |
| 4,464,420 | 8/1984 | Taguchi et al. | 427/96 |
| 4,490,429 | 12/1984 | Tosaki et al. | 428/195 |
| 4,540,621 | 9/1985 | Eggerding et al. | 428/209 |
| 4,540,671 | 9/1985 | Kondo et al. | 501/9 |

*Primary Examiner*—Patrick Ryan
*Attorney, Agent, or Firm*—Finnegan, Henderson, Farabow, Garrett, and Dunner

[57] ABSTRACT

A ceramic substrate for an electrical device such as a layered circuit or an integrated circuit formed of a crystalline glass or ceramic material having a low densifying temperature such that conductor materials and circuits can be readily formed from high conductivity metals.

14 Claims, 1 Drawing Sheet

CERAMIC SUBSTRATE FOR ELECTRICAL DEVICES

This application is a continuation, of application Ser. No. 817,686, filed Jan. 10, 1986 now abandoned.

BACKGROUND OF THE INVENTION

The present invention relates to a substrate on which can be mounted electrical subsystems such as integrated circuits, multi-layered printed circuits and the like.

The use of a ceramic material as the substrate for such devices has encountered a number of technical difficulties. Where a multi-layered printed circuit is formed on the ceramic substrate, the shrinkage coefficient of the paste-like materials forming printed circuits is so unlike that of the ceramic substrate that the printed circuits crack, warp or form other defects during sintering. Unexamined Japanese Patent Publication 59-101896 discloses a method of manufacturing a multi-layered device to avoid such problems by manipulating the powder sizes of the material forming the substrate with respect to the powder size of the material forming the conductors. While the different particle sizes could be matched to eliminate or reduce the different shrinkage rates upon sintering, control of the particle size for the powder components was difficult. In addition, because the sintering temperature of the ceramic substrate was so high, the conductive metal layer had to be a metal having high thermal resistance such as tungsten or molybdenum. Such metals have high electrical resistance and are unsuitable for high speed signal transmission.

The use of a ceramic substrate in connection with an integrated circuit (IC) has similar problems. A conventional IC package is set out in FIG. 3. Such a device comprises a ceramic substrate 34 on which is mounted a semiconductor element 33 by means of an intermediate joint layer 32 which is normally a metallized or plated layer. A cap 35 protects the semiconductor element 33 and a glass layer 36 seals the substrate and the cap in an air-tight relationship. A terminal member 37 electrically connects the semiconductor element 33 by means of a bonding wire that is led through the glass layer 36.

Alumina has conventionally been used for the ceramic substrate 34 because of its mechanical strength and electrical insulating properties. Use of alumina is not without some technical drawbacks. Alumina has a high dielectric constant, such that it causes delays in signal propagation and its sintering temperature is so high that high melting point metals, such as tungsten and molybdenum or the like, must be used as the signal conductive member and such materials have a high electrical resistance.

Crystalline glass or glass-ceramic materials have also been used in such applications. While the dielectric constant is low and the sintering temperature is low enough to allow use of high conductivity metals such as copper for the signal conductive member, such materials have the disadvantge that the low thermal conductivity adversely affects the heat discharge characteristics of the device.

Ceramic substrates are also used in connection with LSI devices. Conventionally, ceramic materials such as alumina are molded into a sheet-like form, a wiring pattern is formed on the ceramic sheet and a multi-layer structure formed by stacking several of such sheets. The resulting multi-layer structure is sintered. Where such devices are used in information processing apparatus, there has recently been a strong incentive to miniaturize such devices and to improve the packing density by mounting a number of LSI elements on one ceramic substrate. Where the degree of LSI integration is low, the formation of the wiring pattern on only one surface of the substrate is sufficient, therefore, metals having a low electrical resistance such as gold, silver or copper may be used as the wiring material. On the other hand, when the degree of integration is relatively high and there are a relatively large number of LSI elements on the substrate, it is necessary to form the wiring pattern on each of the ceramic sheets constituting the substrate. The ceramic sheets are stacked one on top of the other to form a three-dimensional wiring array that simplifies the wiring between separate substrates. Where conventional ceramics have been used for the LSI substrate, however, it has been necessary to sinter the substrate at high temperatures, for example, in the range of from 1350° to 1600° C. when alumina is used as the ceramic substrate. At such sintering temperatures low melting point metals such as gold, silver, copper, or the like, cannot be used because such a metal will separate due to surface tension of the molten metal. Accordingly, it has been necessary to form the electrical conductors on the substrate by using a high melting point metal such as tungsten, molybdenum, or the like. Such materials, however, have a high electrical resistance in relation to gold, silver, copper, or the like. The electrical resistance of such metals as tungsten, molybdenum, or the like, is about three times as large as gold, silver or copper in resistivity and about five to ten times as large as the latter when the high resistance materials are sintered. As a result, the electrical resistance of the substrate is increased as the number of layers forming the LSI substrate are increased. This causes delays in signal transmission speed and results in a serious problem in high speed information processing apparatus.

In order to solve the above-mentioned problems, Unexamined Japanese Patent Publication No. 57-6257 discloses a means for enabling the use of low temperature sintering of substrates by using glass as the material for the substrate. Gold, silver, copper, or the like, are used for the electrical conductors and are located in paths formed within the substrate. To form such a device, however, it is necessary to perform the sintering operation in a vacuum in order to prevent the formation of voids within the electrical conductors being formed inside the substrate.

Further, it is necessary to provide circuits on the surface of a multi-layer substrate that connect the LSI chips mounted on such a surface to the electrical conductor paths formed inside the substrate. Such circuits are formed of electrically conductive layers applied to the device by vacuum evaporation, sputtering, screen-printing, or the like. As a result, a high degree of surface smoothness (microscopic evenness) and a high degree of flatness (macroscopic evenness) is required for the surface of the substrate such that the conductive layer can be accurately formed. This problem is not addressed in the Unexamined Japanese Patent Publication 57-6257.

As a result of the shortcomings in prior art devices, the present invention has as its principle object the formation of a substrate for a circuit or the like that can be readily formed into a stable electrically and thermally compatible device. It is a further object of the present invention to form such a device at relatively low temperatures. It is an additional object of the invention to problems associated with differential thermal contraction upon formation of such devices. These and other objects of the invention are accomplished by the present invention as disclosed herein.

SUMMARY OF THE INVENTION

To achieve these and other objects of the invention, there is provided a multi-layer circuit device having a substrate of either a crystalline glass or a glass ceramic composite material on which are mounted electrical elements. In a first embodiment, the invention comprises a multi-layer circuit device comprised of a green sheet formed of porous crystalline glass having an insulative portion comprised of a paste of insulating glass thick-film printed on the green sheet. A conductive portion is comprised of an electrically conductive paste thick-film printed on the green sheet. The substrate precursor and the thick-film printed paste are subjected to elevated temperatures to form the multi-layer circuit device.

The second embodiment of the invention is a multi-layered circuit device having a sintered substrate that consists essentially of either crystalline glass or a glass ceramic composite. The substrate includes electrical conductor paths within the substrate and an electrically conductive layer formed on the surface of the substrate by means of a thin film forming technique.

The third embodiment of the invention is a device that contains an integrated circuit. The device has a substrate that consists essentially of a ceramic material that is either crystalline glass or a glass ceramic composite. An integrated circuit element is bonded to the substrate by means of a bonding layer. The bonding layer has a relatively high thermal conductivity.

DESCRIPTION OF THE PREFERRED EMBODIMENTS

Figure 1:
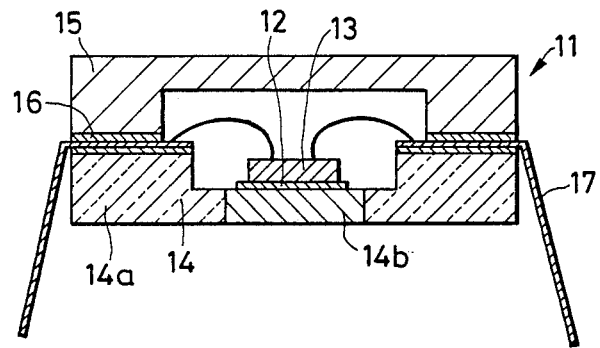
FIG. 1 is a cross-section showing an IC package using a substrate according to one embodiment of the present invention.

As is here embodied the invention comprises a multi-layer circuit substrate that is made of crystalline glass in which an electrically conductive paste and an insulating paste of crystalline glass are thick-film printed alternately a plurality of times on a green sheet. The precursor is "green," (i.e., porous) crystalline glass and the insulating paste contains a particulate glass such that the elevated temperature treatment forms a dense crystalline glass substrate simultaneously with the formation of dense crystalline glass insulating layers and dense layers of conductive material formed from the conductive paste.

It should be noted that in connection with the description of this invention, the formation of layers "on" the substrate does not necessarily mean abutting the sustrate. In other words, the formation of alternate layers of insulating paste and conductive paste are both placed on the substrate, however, they may or may not contact the substrate. In addition, the term "crystalline glass" is defined as glass components that can be densified and rendered crystalline at elevated temperatures.

Preferably, the glass components are of the same type, which means glasses have the same general properties and have the same general characteristics during the densifying elevated temperature treatment. By contrast, the organic components of the paste which are burned out during the thermal treatments such as resin, a caking agent and the like need not be of the same general type.

Because the insulating paste is formed of material that will, during the elevated temperature treatment, form a crystalline glass, it is subjected to a softening phenomenon peculiar to glass which eliminates the formation of cracks, pinholes or the like during such a treatment. Because the material forming the crystalline glass in the insulating paste is of the same general type as that of the sheet-like green sheet, warpage due to the difference in shrinkage coefficients during the elevated temperature treatment does not occur. In addition, because of the similarity in the types of material forming the insulating paste and the substrate the two are tightly bonded to each other. The temperature necessary to densify the crystalline glass of the substrate and the insulating paste is under 1050° C. and, as a result, low resistance metals such as gold, silver, copper, palladium, platinum and mixtures of those metals, or the like, can be used as the electrically conductive material. At such low temperatures, the surface tension of the metals is not sufficient to render shapes formed by the conductive paste discontinuous.

The present invention was used in the following examples:

EXAMPLE 1—GLASS SUBSTRATE

One part of dispersant, 15 parts bonding agent, 8 parts of plasticizer, and 50 parts of solvent were added to 100 parts of glass powder of 2 $\mu$m average particle diameter consisting of 56% of $SiO_2$, 23.5% of $Al_2O_3$, 15% of MgO, 3.5% of ZnO, 1% of $B_2O_3$, and 1% of $P_2O_5$. The materials were mixed, kneaded and molded into a green sheet through a doctor blade method. Separately, an insulating paste was made by adding the above-mentioned organic components to the above-mentioned glass powder to an extent that the viscosity became 600 poise. The multi-layer circuit substrate made of crystalline glass according to the present invention was manufactured in such a manner that gold paste (C-5025 produced by Sumitomo Metal Mining Co., Ltd.) was thick-film printed on the green sheet to form a wiring pattern having a thickness of 25 $\mu$m. The insulating paste was thick-film printed on the wiring pattern to form an insulating layer. The printing operations were repeated and then the structure was sintered at a temperature of 930° C. in air, thereby obtaining a multi-layer circuit device having a crystalline glass substrate with five wiring layers, four crystalline glass insulating layers of 40 $\mu$m film thickness and a substrate of 2 mm thickness.

EXAMPLE 2—CERAMIC SUBSTRATE

For comparison, 8 parts of bonding agent, 4 parts of plasticizer, and 30 parts of solvent were added to 100 parts of ceramic powder of 2 $\mu$m average particle diameter consisting of 96% of $Al_2O_3$ and the remainder parts, of CaO, $SiO_2$, and MgO, mixed, kneaded and molded into a green sheet through a doctor blade method. Separately, an insulating paste was made by adding the above-mentioned organic components to the above-mentioned glass powder to an extent that the viscosity became 600 poise. The multi-layer circuit substrate was manufactured in such a manner that tungsten paste (3TW-100 produced by Asahi Chemical Co., Ltd.) was thick-film printed on the green sheet to form a wiring pattern having a thickness of 25 $\mu$m. The insulating paste was thick-film printed on the wiring pattern to form an insulating layer. The printing operations were repeated, and then the structure was sintered at a temperature of 1500° C. in an atmosphere of hydrogen, thereby obtaining a multi-layer circuit device having a ceramic substrate with five wiring layers, four ceramic insulating layers of 40 $\mu$m film-thickness and a substrate of 2 mm thickness.

The results obtained by estimating various characteristics of the multi-layer circuit substrate made of crystalline glass according to the present invention and the multi-layer circuit substrate made of ceramic are shown in the following Table.

TABLE

| | Comparison example of ceramic multilayer circuit substrate | Example of the Invention of crystallized glass multilayer circuit substrate |
|---|---|---|
| Existence of pin hole, crack, warp, disconnection, etc. | pin holes exist | none of them exist |
| Resistance across insulating layers at 100 volts (n = 5) | $1 \times 10^{10}$ ohms | $1 \times 10^{11}$ or more |
| Withstand voltage break down at 100 volts (n = 5) | 1-2 kv/mm | 2 kv/mm or more |

As seen in the above Table, the multi-layer circuit substrate made of crystalline glass according to the present invention is low in the rate of occurrence of substandard products and superior in the insulating property between the layers.

Because the multi-layered device formed of the present invention reduces the occurence of substandard products, multi-layered circuit devices can be manufactured inexpensively. Futhermore, because the insulating property between the layers is superior to prior art devices, the thickness of the insulating layer can be reduced, thereby improving the printing steps. In addition, because the process of making the device allows the use of high conductivity electrically conductive metals, the signal transmission speed for such devices can be improved.

In addition to the materials noted above in the examples, glass capable of forming a crystalline body having a composition of $SiO_2$—$Al_2O_3$—$MgO$—$ZnO$—$B_2O_3$—$P_2O_5$ described in Unexamined Japanese Patent Publication 59-92943 and a glass composition of $SiO_2$—$Al_2O_3$—$MgO$—$B_2O_3$—$CaO$—$ZrO_2$ disclosed in Unexamined Japanese Patent Publication 59-83957 may also be used.

In another embodiment of the present invention, a multi-layer circuit substrate is made of a sintered body of crystalline glass or a glass-ceramic composite. The substrate is provided with electrical conductor paths formed within the substrate. An electrically conductive layer is formed on the surface of the substrate through a thin film forming process.

The present invention has been attained by finding suitable materials which make it possible to form the substrate without producing voids inside the substrate. This makes it possible to form substrates having a surface with a degree of smoothness, as well as a degree of flatness which is sufficiently accurate for forming a metal film through a thin film process even without grinding the surface after the sintering step. In addition, the substrate can be densified at a temperature at which a low melting point metal such as gold, silver, copper, or the like, can be used as a material for the entire conductive path formed inside the substrates. Such metals are superior in electrical, mechanical and thermal properties.

The crystalline glass body or the glass-ceramic composite body to be used according to the present invention may be those as follows:

The crystalline glass body, as disclosed, for example, in Unexamined Japanese Patent Publication No. 59-92943, prepared in such a manner that the crystalline glass consists essentially of 54 to 63 weight % of $SiO_2$, 20 to 28 weight T of $Al_2O_3$, 10 to 18 weight % of MgO and 2 to 6 weight % of ZnO and additive components consisting of 0.1 to 6 weight % of $B_2O_3$ and/or $P_2O_5$. The composition is comminuted, formed into a mixture, molded and densified at high temperatures to form a crystalline material.

Alternatively, a glass-ceramic composite body, as disclosed, for example, in Unexamined Japanese Publication No. 59-64545 may be used. Such a material is prepared in such a manner that 5 to 60 weight % of ceramic particles each covered with $SiO_2$ over its surface are dispersed in a glass matrix of crystalline glass having a coefficient of expansion of 5 to 45 $\times 10^{-7}$.

A crystalline glass body, as disclosed, for example, in Unexamined Japanese Patent Publication No. 59-83957, prepared in such a manner that glass component consists essentially of 40 to 52 weight % of $SiO_2$, 27 to 37 weight % of $Al_2O_3$, 10 to 20 weight % of MgO, 2 to 8 weight % of CaO, and 0.1-3 weight % of $ZrO_2$ may be used. The composition is comminuted, formed into a mixture, molded and densified at high temperatures to form a crystalline material.

The crystalline glass body, as disclosed for example in Unexamined Japanese Patent Publication No. 59-137341, prepared in such a manner that glass component consists essentially of 55 to 63 weight % of $SiO_2$, 20 to 28 weight % of $Al_2O_3$, 1 to 8 weight % of $Y_2O_3$ and 10 to 20 weight % of MgO, with additive components consisting of 0.1 to 5 weight % of $B_2O_3$ and/or $P_2O_5$ may be used. The composition is comminuted, formed into a mixture, molded and densified at high temperature to form a crystalline material.

All the substrates made of the foregoing materials have a degree of surface smoothness and a degree of surface flatness sufficient to omit the grinding step. In other words, the substrate may be formed only by sintering after molding through an ordinary process such as a green sheet process, a metal-mold pressing process, or the like. Such substrates have superior electrical, mechanical and thermal characteristics such that the dielectric constant is low and the coefficient of thermal expansion is the same degree as an Si chip.

Further, those materials described above can be sintered at a temperature significantly lower than alumina, so that a metal having a low melting point, such as gold, silver, copper, or the like, can be used as a material for the electrical conductor paths to be formed inside the substrate.

As the material for the conductor paths formed inside the substrate, a metal of low electric resistance, such as silver, copper, palladium, platinum, a mixture of them, or the like, is preferable and these low melting point metals described above may also be used. Those electric conductor paths are formed inside the substrate in such a manner that electrical conductor paths are formed on each of a plurality of substrates by ordinary methods and a plurality of substrates are then stacked and integrated.

The electrically conductive layer formed on the surface of the substrate through a thin film process such as vacuum evaporation, sputtering, or the like, must be strongly adhered to the substrate. For example, as such materials it is possible to use metals in 4B-group (Ti, Zr, Hf), 5B-group (V, Nb, Ta) and 6B-group (Cr, Mo, W), and the compounds thereof, for example, TaN, CrNi, TaAl, TaAlN, TaSi, CrSiO, etc.

The process of manufacturing the multi-layer circuit substrates according to the present invention is basically the same as that of manufacturing the conventional multi-layer circuit substrate in which a ceramic such as alumina, or the like, is used.

The process is as follows:

(1) Powder of crystalline glass or a glass-ceramic composite prepared as a material for a substrate is mixed and kneaded with an additive such as a caking agent, a plasticizer, a dispersant, or the like, and formed into green sheets by a doctor blade method, or the like.

(2) Each green sheet is punched so as to have a predetermined size and then formed with through holes at required portions;

(3) The through holes are filled with electrically conductive paste and then an electrically conductive pattern forming internal electrical conductor paths is formed through screen printing or the like;

(4) The green sheets each formed with the internal electrical conductor paths are stacked one on one and pressed to adhere to each other to form a substrate;

(5) The stacked array is heated at 300° to 500° C. to remove the binders in the substrate and then sintered at a temperature which is determined by the kind of material being densified; and (6) An electrically conductive layer is formed on the surface of the sintered body through a thin film process such as sputtering, or the like.

Paste generally used for an alumina substrate, or the like, can be used as the electrically conductive paste to be used in step (3) described above.

In the case where a metal which can be easily oxidized (such as copper or the like) is selected for the electrically conductive portion, step (5) above should be done in a non-oxidizing atmosphere.

It is particularly preferable to use the crystalline glass body or the glass-ceramic complex body disclosed in Unexamined Japanese Patent Publication Nos. 59-92943, 59-64545, 59-83957 and 59-137341 as the material for the substrate, because the coefficient of expansion thereof is substantially the same degree as an LSI chip made of Si and the dielectric constant of such materials is lower than that of an alumina substrate.

By means of the present invention, it is possible to obtain a multi-layer circuit substrate having internal electric conductor paths of a low electrical resistance value and to produce LSI's and very LSI's eliminating the problem of lower signal transmission speed. Furthermore, the electric resistance of the electrical conductor paths inside the substrate is low enough to reduce the amount of heat-generation thereby reducing the energy used for cooling such devices in use.

Further, according to the present invention, circuits or elements can be formed directly through a thin film process on the multi-layer circuit substrate which has not been ground after sintering burned, so that the manufacturing process can be simplified. The present embodiment of the invention was used to make the following examples:

EXAMPLE 3

Samples having the compositions as shown in Table 1 were formed into green sheets through a doctor blade method. Predetermined internal electric conductor paths were formed on the green sheets with gold paste through screen printing. The substrate formed by stacking and adhering the green sheets one on top of another was sintered at 900° to 1000° C. Subsequently, the conditions of the internal electrical conductor paths were inspected to determine if they were continuous.

After this measurement, the degree of surface roughness of the same samples was measured. The degree of surface roughness was measured as a centerline average roughness (Ra) in accordance with JIS BO601 where 4 mm was the measured length and 0.8 mm the cut off value.

Next, a metal layer having a thickness of 1000 to 2000 Å and a shape of square of $2 \times 2$ mm$^2$ was formed on the surface of each of the samples through a high-frequency sputtering process with Ti, Mo and Ni. The degree of adherence between the metal layer and the substrate was measured to obtain peeling strength at the contacting portion of a metal wire (0.6 mm Sn-plated Cu wire) soldered (with a solder consisting of 60% of Sn and 40% of Pb).

For comparison, a conventional multi-layer circuit substrates made of alumina were manufactured by using tungsten paste for internal electrical conductor paths and the same experiments as those described above were performed. The multi-layer circuit substrates made of alumina were sintered at 1500° C.

The coefficient of thermal expansion of each material was described for reference in the Table 1. The coefficient of thermal expansion of Si is $24 \times 10^{-7}$/°C.

As a result of the above-mentioned experiments, it was found that the multi-layer circuit substrate according to the present invention has no disconnection in the electrical conductor paths inside the substrate in the sintered state, and has a surface roughness of substantially the same degree, even in a non-ground state, as that of an alumina substrate with its surface ground. Furthermore, it was confirmed that the metal layer was sufficiently adherent to the substrate.

TABLE 1

| Sample No. | Component (weight %) | | | | Other component | | Inside conductor path disconnection | Surface roughness μm Ra | Peeling strength kg/4 mm$^2$ | Dielectric constant (1 MHz) | Thermal expansion coeffic. $\times 10^{-7}$/°C. | |
|---|---|---|---|---|---|---|---|---|---|---|---|---|
| | SiO$_2$ | Al$_2$O$_3$ | MgO | B$_2$O$_3$ | | | | | | | | |
| 1 | 56.0 | 23.5 | 15.0 | 1.0 | ZnO 3.5 | P$_2$O$_5$ 1.0 | no | 0.10 | >5 | 5.5 | 30 | Unex. Pub. 59-92943 |

TABLE 1-continued

| Sample No. | Component (weight %) | | | | | | Inside conductor path disconnection | Surface roughness μm Ra | Peeling strength kg/4 mm² | Dielectric constant (1 MHz) | Thermal expansion coeffic. ×10⁻⁷/°C | |
|---|---|---|---|---|---|---|---|---|---|---|---|---|
| | $SiO_2$ | $Al_2O_3$ | MgO | $B_2O_3$ | Other component | | | | | | | |
| 2 | 57.5 | 25.5 | 12.0 | 2.0 | ZnO 2.5 | $P_2O_5$ 0.5 | | no | 0.12 | >5 | 5.2 | 25 | Unex. Pub. 59-92943 |
| 3 | 52.0 | 20.0 | 17.0 | 2.0 | $TiO_2$ 7.0 | $P_2O_5$ 2.0 | +$Al_2O_3$ 20 vol % | no | 0.15 | >5 | 5.5 | 37 | Unex. Pub. 59-64545 |
| 4 | 52.0 | 20.0 | 17.0 | 2.0 | $TiO_2$ 7.0 | $P_2O_5$ 2.0 | +BN 20 vol % | no | 0.20 | >5 | 5.0 | 32 | Unex. Pub. 59-64545 |
| 5 | 45.0 | 32.0 | 12.0 | 4.5 | CaO 4.5 | $ZrO_2$ 2.0 | | no | 0.15 | >5 | 5.5 | 22 | Unex. Pub. 59-83957 |
| 6 | 50.0 | 30.0 | 13.0 | 3.0 | CaO 3.0 | $ZrO_2$ 1.0 | | no | 0.10 | >5 | 5.8 | 16 | Unex. Pub. 59-83957 |
| 7 | 58.0 | 22.0 | 12.0 | 1.0 | $Y_2O_3$ 6.0 | $ZrO_2$ 1.0 | | no | 0.10 | >5 | 5.7 | 35 | Unex. Pub. 59-137341 |
| 8 | 55.0 | 17.0 | 21.0 | 3.0 | $Y_2O_3$ 3.0 | $ZrO_2$ 1.0 | | no | 0.13 | >5 | 5.5 | 30 | Unex. Pub. 59-137341 |
| Comp. 1 | $Al_2O_3$ 92% Remainder $SiO_2$—CaO—MgO—BaO glass | | | | | | | exist | 0.50 | Immeasurable | 8.5 | 66 | Δ |
| Comp. 2 | The surface of the Comp. 1 was round. | | | | | | | exist | 0.20 | 3.0 | 8.5 | 66 | |

Samples 1-8 are products according to the invention and Comp. 1-2 are examples for comparison.
Unex. Pub. means Japanese patent unexamined publication.
The mark Δ represents the fact that metallizing by a thin film method could not be preformed.

As here embodied, the invention further comprises a device containing an integrated circuit. The device includes a substrate consisting essentially of a ceramic material selected from the group consisting of crystalline glass and a glass-ceramic composite. An integrated circuit is bonded to the substrate by means of a bonding layer having a relatively high thermal conductivity.

On the surface of a substrate for mounting a semiconductor element such as an IC, a bonding layer adheres to the semiconductor element and absorbs most of the heat generated by the semiconductor element in operation. However, since a good thermally conductive material is used for the bonding layer, the heat is discharged efficiently and the semiconductor element is prevented from rising to an abnormally high temperature. The larger the ratio of volume occupied by the thermally conductive bonding layer on the substrate, the more significant is this effect.

As a material for the thermally conductive bonding layer employed according to the present invention, it is preferable to use a metal or ceramic having a heat conductivity of 40 W/m·k or more, such as, for example, SiC, BeO, BN, $Si_3N_4$, AlN, W, or Mo.

As the crystalline glass body employed according to the present invention, it is preferable to use a crystalline glass body having a dielectric constant of 6.5 or less such as those disclosed in Unexamined Japanese Patent publications as follows:

The crystalline glass body disclosed, for example, in Unexamined Japanese Patent Publication No. 59-83957, prepared in such a manner that the crystalline glass components consist essentially of 40 to 52 weight % of $SiO_2$ (hereinafter the word "weight" is omitted), 27 to 37 % of $Al_2O_3$, 10 to 20% of MgO, 2 to 8% of CaO, and 0.1 to 3% of $ZrO_2$. These materials are comminuted, formed into a mixture, molded and treated at an elevated temperature to form a crystalline material.

The crystalline glass body may also be that disclosed, for example in Unexamined Japanese patent Publication No. 59-92943, prepared in such a manner that crystalline glass components consist essentially of 54 to 63% of $SiO_2$, 20 to 28 weight % of $Al_2O_3$, 10 to 18% of MgO, and 2 to 6% of ZnO, and additive components consisting of 0.1 to 6% of $B_2O_3$ and/or $P_2O_5$. These materials are comminuted, formed into a mixture, molded and treated at an elevated temperature to form a crystalline material.

The crystalline glass body disclosed, for example, in Unexamined Japanese Patent Publication No. 59-137341, prepared in such a manner that the crystalline glass components consist essentially of 55 to 63% of $SiO_2$, 20 to 28% of $Al_2O_3$, 1 to 8 % of $Y_2O_3$ and 10 to 20% of MgO, and additive components consisting of 0.1 to 5% of $B_2O_3$ and/or $P_2O_5$. These materials comminuted, formed into a mixture, molded and treated at an elevated temperature to form a crystalline material.

As a material for the crystalline glass-ceramic composite body employed according to the present invention, it is preferable that it have a dielectric constant of 6.5 or less such as a ceramic insulating material disclosed for example in Unexamined Japanese Patent Publication No. 59-107596, which includes at least two kinds of silicon oxides different in crystal form in a glass matrix.

Figure 2:
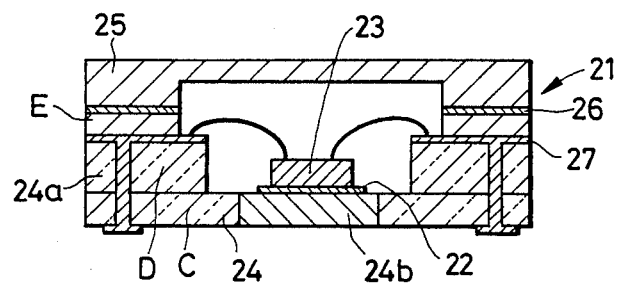
FIG. 2 is a cross-section showing an IC package using a substrate according to another embodiment of the present invention.

Two specific embodiments of the invention are depicted in FIGS. 1 and 2.

Figure 3:
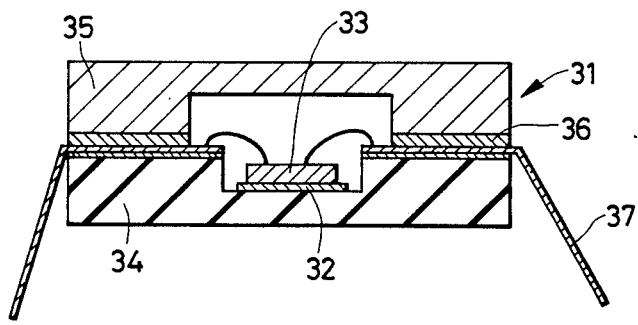
FIG. 3 is a cross-section showing a conventional IC package.

FIG. 1 is a cross-section showing an IC package 11 having a semiconductor element 13 disposed on a substrate 14 including good heat conductive body 14b by means of a bonding layer 12. In FIG. 1, the materials of and the positional relationship among a cap 15, a glass layer 16, and a terminal member 17 are substantially the same as those corresponding parts of the conventional structure of FIG. 3 so no detailed description is included.

FIG. 2 is a cross-section which shows an IC package 21 having a semiconductor element 23 bonded to the thermally conductive body 24b through a bonding layer 22. In the embodiment of FIG. 2, the materials of and the positional relationship of the cap 21 and the glass layer 26 are substantially the same as those corresponding parts of the conventional structure shown in FIG. 3 and, therefore, a description of such elements is omitted.

Moreover, in the foregoing embodiments, although the crystalline glass body 24a and the thermally conductive body 24b were joined with each other by filling a portion therebetween with paste containing crystalline glass, the present invention is not limited to the use of the above-mentioned paste, but paste containing metallized ink can be used.

The invention was used in the following examples:

EXAMPLE 4

Crystalline glass powder consisting essentially of 56.0% of $SiO_2$, 23.5% of $Al_2O_3$, 15.0% of MgO, 1.0% of $B_2O_3$, 3.5% of ZnO and 1.0% of $P_2O_5$ and an additive organic binder agent were mixed and pressed to form a molded body (A) having a through hole of 8 mm $\phi$ extending vertically at a center portion of the molded body and an outer size of $33 \times 15 \times 4.0t$ (edge portion 8t) mm. Separately, SiC powder, a sintering aid and an organic binder were mixed, pressed within a metal mold, and then charged into a graphite mold so as to be hot-pressed at a temperature of 2000°0 C. for one hour to produce a sintered body (B) having a size of $6.5\phi \times 3.2t$ mm. The molded body A and the sintered body B disposed in the through hole of the molded body A were sintered at a temperature of 950° C. in air, so that the molded body A and the sintered body B respectively became a crystalline glass body 14a and a heat conductive body 14b as shown in FIG. 1. The molded body A and the sintered body B were integrally attached with each other owing to shrinkage and softening due to sintering, thereby obtaining a substrate 14. The permittivity of the crystalline glass body 14a was 5.5 (1 MHz), and the heat conductivity of the thermally conductive body 14b was 110 w/m·k.

EXAMPLE 5

Crystalline glass powder having the same composition as that described in the previous Example added with a caking agent, a plasticizer, and a dispersant were mixed, kneaded, molded in the form of sheet by a doctor blade method, and then punched to form through holes and an opening portion at pre-determined positions, thereby obtaining a molded body C having an outer size of $50 \times 50 \times 0.8t$ mm and an opening size of $20 \times 20 \times 0.8t$ mm. Separately, a material of the same type as the molded body C was molded in the form of sheet, and punched to form through holes at positions such that the horizontal distances from the outer end surface to the respective through holes were coincident with those of the corresponding through holes of the molded body C and an opening portion at a center portion of thereof such that the opening portion was a little wider than the opening portion of the molded body C, thereby obtaining a molded body D having an outer size of $50 \times 50 \times 0.63t$ mm. Further, a material of the same type as the molded bodies C and D was molded in the form of sheet, and punched to form an opening portion that was a little wider than the opening portion of the molded body C, thereby obtaining a molded body E having an outer size of $50 \times 50 \times 0.63t$ mm. Next, the molded body D was stacked on the molded body C, and thick-film wiring patterns 27 were respectively formed on the exposed main surfaces of the molded bodies C and D by using electrically conductive paste. At the same time, the wiring patterns respectively formed on the molded bodies C and D were connected with each other by filling up the through holes of the molded bodies C and D with the electrically conductive paste, the molded body E was stacked on the molded body D, and then the molded bodies C, D and E were pressed to adhere to each other, degreased, and sintered at a temperature of 950° C., thereby producing a crystalline glass body 24a. Next, a thermally conductive body 24b made of tungsten and having a size of $15 \times 15 \times 1.3t$ mm was fitted in the open portion provided in the molded body C of the crystalline glass body 24a. The open portion was filled with paste containing crystalline glass, the crystalline glass was melted at a temperature of 500° C. and then cooled, thereby producing a substrate 24 in which the crystalline body 24a and the thermally conductive body 24b were integrated with each other.

A malfunction due to an abnormal temperature rise of the semiconductor element seldom occurs because the heat generated by the semiconductor element can be easily discharged. Since the dielectric constant is low at portions other than the bonding layer where a semiconductor element is attached, the speed of signal propagation is high.

In such a manner, the present invention provides an improved device for mounting circuits, IC's, LSI's, VLSI'S and the like. The present invention has been disclosed in terms of preferred embodiments but is not limited thereto. The scope of the present invention is determined by the appended claims and their equivalents.

What is claimed is:

1. A multi-layer circuit device comprising:
    a green sheet comprised of porous crystalline glass, an insulative portion comprised of a paste of insulating glass thickfilm printed on said green sheet, said paste containing insulating glass consisting essentially of 54 to 63% weight % $SiO_2$, 20 to 28 weight % $Al_2O_3$, 10 to 18 weight % MgO, 2 to 6 weight % ZnO, and 0.1 to 6 weight % of an additive component, said additive component being selected from the group consisting of $B_2O_3$ and $P_2O_5$, and a conductive portion comprised of an electrically conductive paste thick-film printed on said green sheet, said electrically conductive paste containing a metal selected from the group consisting of Au, Ag, Cu, Pd, Pt, and mixtures thereof, said green sheet and said thick-film printed pastes being subjected to elevated temperatures at which said electroconductive paste is not rendered discontinuous to form said multi-layer circuit device.

2. The multi-layer circuit device of claim 1 wherein said insulating paste has a film thickness of 30 to 40 $\mu$m.

3. A multi-layered circuit device comprising:
    a sintered substrate consisting essentially of a material selected from the group consisting of crystalline glass and a glass-ceramic composite, said substrate having a surface with a degree of smoothness and a degree of flatness so that an effective electrically conductive layer can be formed on said substrate by means of a thin film forming technique without grinding said substrate after sintering, said substrate including electrical conductor paths within said substrate, and an electrically conductive layer formed on the surface of said substrate, said layer being formed on said substrate by means of a thin film forming technique.

4. The multi-layer circuit device of claim 3 wherein said sintered substrate consists essentially of crystalline glass, said crystalline glass having a composition consisting essentially of 54 to 63 weight % $SiO_2$, 20 to 28 weight % $Al_2O_3$, 10 to 18 weight % of MgO, 2 to 6 weight % ZnO and an additive component of 0.1 to 6 weight %, said additive component being selected from the group consisting of $B_2O_3$ and $P_2O_5$, said substrate being formed by comminuting said materials, forming a particulate mixture, molding said mixture and subjecting said mixture to high temperatures to form said crystalline glass.

5. The multi-layered circuit device of claim 3 wherein said sintered substrate consists essentially of a glass ceramic composite, said composite comprising from 5 to 60 volume percent ceramic particles, said particles having a layer of $SiO_2$, said particles being dispersed in a matrix selected from the group consisting of glass and crystalline glass, wherein said substrate material has a coefficient of thermal expansion in the range of from 5 to $45 \times 10^{-7}$ per degree C.

6. The multi-layered circuit device of claim 3 wherein said sintered substrate consists essentially of crystalline glass, said crystalline glass having a composition consisting essentially of 40 to 50 weight % $SiO_2$, 20 to 37 weight % $Al_2O_3$, 10 to 20 weight % MgO, 2 to 8 weight % CaO, and 0.1 to 3 weight % $ZrO_2$, wherein said crystalline glass substrate is prepared by comminuting said materials, forming a particulate mixture, molding said mixture and subjecting said mixture to high temperatures to form said crystalline glass substrate.

7. The multi-layered circuit device of claim 3 wherein said sintered substrate consists essentially of crystalline glass, said crystalline glass having a composition consisting essentially of 55 to 63 weight % $SiO_2$, 20 to 28 weight % $Al_2O_3$, 1 to 8 weight % $Y_2O_3$, 10 to 20 weight % MgO and 0.1 to 5 weight % of an additive component, said additive component being selected from the group consisting of $B_2O_3$ and $P_2O_5$, wherein said crystalline glass substrate is prepared by comminuting said materials, forming a particulate mixture, molding said mixture and subjecting said mixture to high temperatures to form said crystalline glass substrate.

8. The multi-layered circuit device of claim 3 wherein said electrically conductive layer is comprised of a metal or compound of a metal selected from the group consisting of Ti, Zr, Hf, Nb, Ta, Cr, Mo and W.

9. A multi-layered circuit device of claim 3 wherein said electrical conductor paths within said substrate consists essentially of a metal selected from the group consisting of Au, Ag, Cu, Pd, Pt or mixtures thereof.

10. A device containing an integrated circuit, said device comprising:
a substrate consisting essentially of a ceramic material selected from the group consisting of crystalline glass and a glass-ceramic composite, said substrate having a permittivity of 6.5 or less, an integrated circuit element bonded to said substrate, and a bonding layer bonding said integrated circuit to said substrate, said bonding layer consisting essentially of a material selected from the group consisting of WSiC, BeO, Bn, $Si_3N_4$, AlN, W, and Mo and having a thermal conductivity of at least 40 w/m·k.

11. The device of claim 10 wherein said bonding layer consists essentially of metal.

12. The device of claim 10 wherein said bonding layer consists essentially of a ceramic material.

13. A multi-layer circuit device comprising:
a green sheet comprised of porous crystalline glass, an insulative portion comprised of a paste of insulating glass thick-film printed on said green sheet, said paste containing insulating glass consisting essentially of 40 to 52 weight % $SiO_2$, 27 to 37 weight % $Al_2O_3$, 10 to 20 weight % MgO, 2 to 8 weight % CaO, and 0.1 to 3 weight % $ZnO_2$, and a conductive portion comprised of an electrically conductive paste thick-film printed on said green sheet, said green sheet and said thick-film printed pastes being subjected to elevated temperatures to form said multi-layer circuit device.

14. A multi-layer circuit device comprising:
a green sheet comprised of porous crystalline glass, an insulative portion comprised of a paste of insulating glass thick-film printed on said green sheet, said paste containing insulating glass consisting essentially of 55 to 63 weight % $SiO_2$, 20 to 28 weight % $Al_2O_3$, 10 to 20 weight % MgO, 1 to 8 weight % $Y_2O_3$, and 0.1 to 5 weight % of an additive component, said additive component being selected from the group consisting of $B_2O_3$ and $P_2O_5$, and a conductive portion comprised of an electrically conductive paste thick-film printed on said green sheet, said green sheet and said thick-film printed pastes being subjected to elevated temperatures to form said multi-layer circuit device.

* * * * *

UNITED STATES PATENT AND TRADEMARK OFFICE
CERTIFICATE OF CORRECTION

PATENT NO. : 4,943,470

DATED : July 24, 1990

INVENTOR(S) : Hisaharu Shiromizu, et al

It is certified that error appears in the above-identified patent and that said Letters Patent is hereby corrected as shown below:

Claim 10, Column 14, Line 15, change "WSIC" to --SIC--;

Claim 13, Column 14, Line 28, change "$ZNO_2$" to --$ZRO_2$--.

Signed and Sealed this

First Day of December, 1992

*Attest:*

DOUGLAS B. COMER

*Attesting Officer*   Acting Commissioner of Patents and Trademarks